United States Patent [19]

Hunsperger et al.

[11] 4,264,875

[45] Apr. 28, 1981

[54] SYSTEM FOR OPTICAL INJECTION PHASE LOCKING AND SWITCHING OF MICROWAVE OSCILLATORS

[75] Inventors: Robert G. Hunsperger, Newark, Del.; Michael K. Barnoski, Pacific Palisades; Huan-Wun Yen, Westlake Village, both of Calif.

[73] Assignee: Hughes Aircraft Company, Culver City, Calif.

[21] Appl. No.: 63,889

[22] Filed: Aug. 3, 1979

Related U.S. Application Data

[63] Continuation of Ser. No. 872,538, Jan. 26, 1978, abandoned.

[51] Int. Cl.$^3$ .............................................. H03L 7/24
[52] U.S. Cl. ...................................... 331/66; 307/312; 331/107 DP; 331/117 R; 331/172; 332/3; 332/7.51
[58] Field of Search .............. 331/66, 107 R, 107 DP, 331/107 G, 117 R, 172, 173, DIG. 1; 332/3, 7.51; 357/30; 307/311, 312

[56] References Cited

U.S. PATENT DOCUMENTS

| | | | |
|---|---|---|---|
| 3,628,185 | 12/1971 | Evans et al. | 331/107 DP |
| 3,651,423 | 3/1972 | Sewell | 331/66 |
| 3,662,289 | 5/1972 | Dienst | 332/3 |
| 3,678,280 | 7/1972 | Yamashita | 332/3 X |

FOREIGN PATENT DOCUMENTS

| | | |
|---|---|---|
| 1120574 | 7/1968 | United Kingdom . |
| 1188986 | 4/1970 | United Kingdom . |
| 1258113 | 12/1971 | United Kingdom . |
| 1271077 | 4/1972 | United Kingdom . |

OTHER PUBLICATIONS

"Illumination Improves Trapatt Performance", Microwaves, Jan. 1977, p. 14.
"Laser, Trapatt Diode Yield Speed, Power", Electronics, Aug. 3, 1978, p. 46.

*Primary Examiner*—Siegfried H. Grimm
*Attorney, Agent, or Firm*—Lawrence V. Link, Jr.; W. H. MacAllister

[57] ABSTRACT

In accordance with one embodiment of the invention, a microwave signal is used to modulate a laser diode and the resultant modulated light output energy from the laser diode is applied through an optical fiber waveguide to the active solid state component in a microwave oscillator circuit such that the output signal from the microwave oscillator is phase locked to the modulation carried by the light energy. The invention allows optical injection phase locking to be achieved not only at the fundamental frequency of the modulating signal, but also at various harmonics thereof; and "on-off" switching of the microwave oscillator can be controlled simultaneously with phase locking.

18 Claims, 4 Drawing Figures

SYSTEM FOR OPTICAL INJECTION PHASE LOCKING AND SWITCHING OF MICROWAVE OSCILLATORS

This is a continuation of application Ser. No. 872,538 filed Jan. 26, 1978 and now abandoned.

BACKGROUND OF THE INVENTION

This invention relates generally to electronic oscillator circuits and more particularly to such oscillator circuits which may be "phase locked" and/or switched "on" and "off" by carriers optically generated in semiconductor elements of microwave solid state oscillators.

Many applications, such as radar systems having antenna arrays, for example, require phase coherency between a number of remotely located microwave subsystems. Such phase coherency has been generally implemented in present systems either by using a single microwave oscillator and dividing the output for distribution, or by phase locking separate oscillators by injection of a microwave reference signal. In accordance with either of these signal distribution techniques, microwave energy is routed to the remotely located subsystems by metal waveguides or coaxial cables which add undesirable weight to the system.

An article entitled "Illumination Improves Trapatt Performance" on page 14 of the January, 1977, issue of the magazine "Microwaves" relates to a scheme for using optical illumination to improve the performance of Trapatt oscillators. The article also suggests that by varying the optical illumination level, the Trapatt output frequency can be varied to obtain ultra-fast intrapulse frequency switching. By way of contrast, the subject invention uses modulated optical signals as the illuminating source and a solid state oscillator detects and interacts with the "dc" component and the modulation component of the optical signals to achieve switching and phase locking, respectively, of the oscillator.

SUMMARY OF THE INVENTION

Briefly, in accordance with one embodiment of the subject invention, optical signals are generated by a light source which includes a first IMPATT diode oscillator which modulates a GaAlAs injection laser diode and the optical signals are applied to a second oscillator by means of an optical fiber waveguide. The second oscillator includes an IMPATT diode in a tuned microwave cavity having a feedthrough port which allows the optical fiber waveguide to be butt coupled to the junction region of the IMPATT diode. Since the diode junction is reverse biased under normal IMPATT operating conditions, it functions also as a photodiode and incident photons from the optical signal generate hole-electron pairs which contribute to the avalanche current of the IMPATT diode. As a result of the photon action, the oscillations of the second oscillator are locked in phase with the modulation component in the optical signal. When the IMPATT diode of the second oscillator is biased just below the threshold of oscillation, said oscillator can be triggered into oscillation by optical illumination of sufficient intensity, and if the illuminating signal has the proper "dc" component, as well as modulation component, the oscillator can be switched "on and off" while maintaining phase coherence.

It is therefore a primary object of the subject invention to provide means for phase locking remotely located oscillators in response to modulated light signals.

Another object of the subject invention is to provide means for switching remotely located oscillators in response to applied light signals.

A further object of the subject invention is to provide means for phase locking and/or switching remotely located oscillators by means of data transmitted over light weight optical fiber waveguides.

Yet another object of the subject invention is to provide means for optically synchronizing solid state microwave oscillators in which the avalanche breakdown of the diode element is triggered optically by injecting a light pulse into the reverse-biased junction region thereof, whereby the light pulse stimulates the onset of avalanche-breakdown current pulse generation and resulting microwave emission.

A still further object of the subject invention is to provide means for synchronizing a microwave oscillator, i.e. provide phase coherent microwave emissions by means which utilize light weight optical fibers for interconnecting the oscillator to a synchronizing source.

BRIEF DESCRIPTION OF THE DRAWINGS

These and other objects, features and advantages of the invention will become apparent to those skilled in the art in view of the following detailed description taken in conjunction with the accompanying drawings wherein like reference numerals indicate like or corresponding parts and wherein.

DESCRIPTION OF THE PREFERRED EMBODIMENTS

Figure 1:
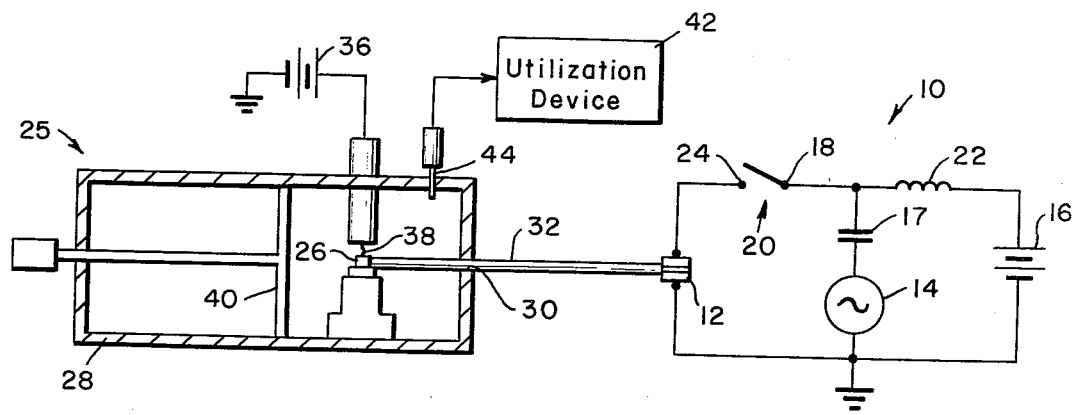
FIG. 1 is a schematic and block diagram of one preferred embodiment of the subject invention which comprises a microwave oscillator that is adapted for phase locking and switching in response to optical energy applied through an optical fiber waveguide.
Figure 3:
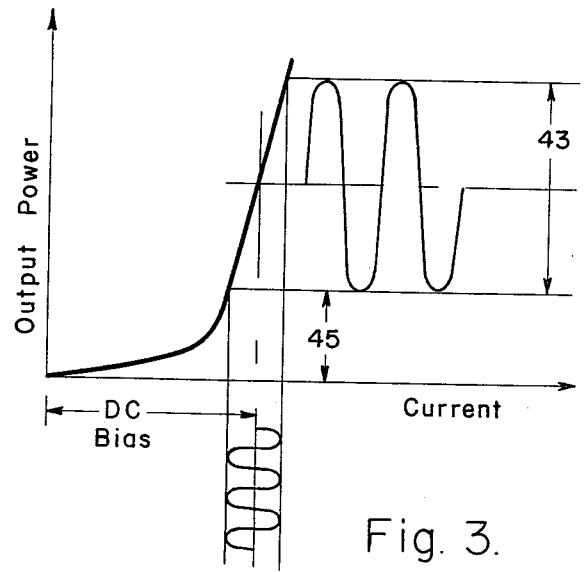
FIG. 3 is a graph of output optical power versus input signal for the optical source 10 shown in FIG. 1.

Referring first to FIG. 1, optical signals are produced by a source 10 which includes a cw GaAlAs injection laser diode 12, a microwave energy source 14, and a dc bias source 16. The microwave oscillator 14 is coupled through a capacitor 17 to the input terminal 18 of a switch 20 and the dc bias source 16 is coupled through a coil 22 to the terminal 18. The laser diode 12 is connected between the output terminal 24 of switch 20 and ground. The switch 20 is shown as a mechanical device for clarity of illustration; however, it will be readily recognized by those skilled in the art that an electronic device such as an FET gate may preferably be used in lieu of the mechanical switch shown. The optical signals are generated by direct current modulation of the laser diode 12. As shown in FIG. 3, the laser diode 12 is prebiased (by source 16) to slightly above threshold so that the operating point is on the linear section of the laser diode input-output characteristic curve and the rf signal from microwave oscillator 14 is superimposed on the dc prebias level. The modulation depth of the output signal from the laser 12 is shown in FIG. 3 as about 50 percent, and illustrates the presence of a "dc" component 45 as well as a modulation component 43 in the output light energy from laser diode 12.

Figure 2:
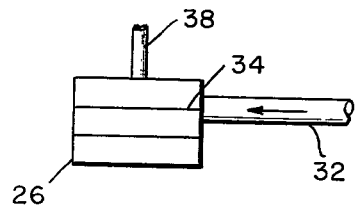
FIG. 2 is an expanded view of the active solid state component of the microwave oscillator of FIG. 1.

Again referring primarily to FIG. 1, a microwave oscillator 25 comprises a GaAs IMPATT diode 26 mounted within a tuned microwave cavity structure 28 which may be conventional except for the incorporation of a feedthrough port 30 that allows an optical fiber waveguide 32 to be butt coupled (shown in greater detail in FIG. 2) to the junction (active) region 34 of the diode 26. The other end of the waveguide 32 is butt coupled to the laser diode 12. Diode 26 is biased by means of a dc source 36 and a bias pin 38 in a conventional manner and the cavity is tuned by means of a waveguide tuning short 40. Microwave energy is coupled from cavity structure 28 to a utilization device 42 by output coupling probe assembly 44. Utilization device 42 might comprise the mixer for one channel of an array of radar receivers, for example.

The junction of IMPATT diode 26 is reverse biased under normal operating conditions and consequently it also functions as a photodiode. The incident photons of the optical signal generate hole-electron pairs which contribute to the avalanche current of the IMPATT diode. Therefore, the oscillations of the oscillator 25 will lock in phase with the modulation component in the optical signal generated by the source 10. Also, in accordance with the invention optical injection phase locking may be achieved not only at the fundamental frequency of the modulating signal, but also at various harmonics thereof.

Diode 26 of oscillator 25 may be biased by the dc source 36 to just below the threshold of oscillation, and the diode can be triggered into oscillation by optical illumination having a sufficient "dc" component, i.e. the oscillator 25 is set so that it will oscillate only when diode 26 is illuminated. Since there is no light output from diode 12 when switch 20 is in the open position, the oscillator 25 may be switched on and off by closing and opening, respectively, switch 20. In this regard, the output optical signal from the source 10 (shown in FIG. 3) may be considered as comprising two components, one being the modulation component signal 43 which provides rf synchronization between the output signals from oscillators 14 and 25, and the other optical signal component is the "dc" component 45 which primarily controls the "turn on/turn off" of oscillator 25. Hence by controlling switch 20 of optical source 10, on/off switching of oscillator 25 may be obtained while maintaining phase coherency between microwave oscillator 14 of optical source 10 and oscillator 25.

Figure 4:
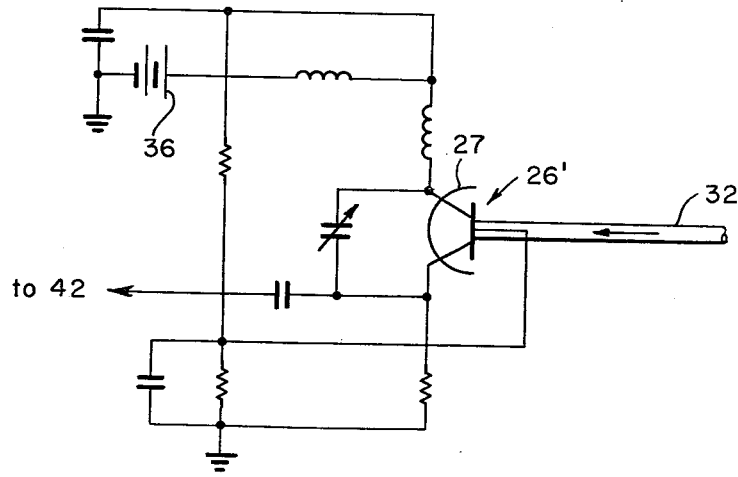
FIG. 4 is a schematic diagram of a second embodiment of an oscillator adapted for phase locking and switching in response to optical energy and which may be used in lieu of oscillator 25 of FIG. 1.

It is noted that while oscillator 25 in the embodiment shown in FIG. 1 incorporates an IMPATT diode, that any "active oscillator device" which has sufficient response to light illumination may be utilized in accordance with the invention, e.g. Gunn devices, field effect transistors, etc. Also the principles of the subject invention are applicable to low frequency as well as microwave and millimeter oscillators. FIG. 4 shows an example of a transistor oscillator circuit 25' which may be used in lieu of the oscillator 25 of FIG. 1. Oscillator 25' is conventional except a portion of metal cap 27 is removed to allow optical fiber waveguide 32 to be butt coupled to silicon transistor 26'. The operating quiescent base current point for a transistor oscillator circuit is normally determined by the biasing voltages. However, optical illumination can generate equivalent base current which effectively varies the operating point.

Another effect of illumination is the modification of the transistor base resistance and collector barrier capacitance due to the additional carriers generated, and transistor oscillators of the type shown in FIG. 4 can experience phase locking and/or switching in response to optical illumination in a manner analogous to the operation of oscillator 25 described previously. In particular if the transistor bias voltage is adjusted such that circuit 25' is slightly below the threshold of oscillation, the circuit will oscillate only when transistor 26' is illuminated. As was the case with the IMPATT oscillator 25, the transistor oscillator 25' is switched on and off primarily in response to the "dc" component 45 (FIG. 3) in the output energy from laser diode 12 (FIG. 1) and the output signal of oscillator 25' is phase locked to the output signal from oscillator 14 (FIG. 1) in response to the modulation component in the output energy from laser diode 12.

Although in the illustrated embodiment only one microwave oscillator (25) is driven by the optical signal source 10 it will be apparent to those skilled in the art that the optical signal from source 10 may be "branched" to a plurality of optical fiber waveguides, and the energy from each fiber waveguide would be used to switch and/or phase synchronize an associated remotely located oscillator such as oscillator 25.

Thus having disclosed new and improved systems for switching and/or phase locking remotely located oscillators in response to light signals, what is claimed is:

1. A system for producing phase synchronized output signals, comprising:
    means for producing a modulated light signal which is sinusoidally modulated at a preselected frequency;
    a first oscillator having an active solid state component; and
    means for applying said light signal to said active solid state component so as to cause the output energy from said first oscillator to be phase synchronized with the modulation component of said light signal.

2. The system of claim 1 wherein said means for applying said light signal comprises an optical fiber coupled between said means for producing a modulated light signal and said active solid state component.

3. The system of claim 1 wherein said active solid state component is an IMPATT diode, said means for producing a modulated light signal includes a laser diode and said means for applying said light signal comprises an optical fiber coupled between said IMPATT diode and said laser diode.

4. The system of claim 1 wherein said oscillator includes means for biasing said solid state component below the oscillation threshold in the absence of the application of said light signal but so that said oscillator oscillates when illuminated by said light signal.

5. The system of claim 1 wherein said means for producing a modulated light signal includes a second oscillator selectively coupled to a laser diode whereby the output light signal from said laser diode is modulated at the frequency of the output signal from said second oscillator.

6. The system of claim 1 wherein said active solid state component is an IMPATT diode.

7. The system of claim 1 wherein said active solid state component is a diode and said means for applying said light signal includes means for applying said light signal to the junction region of said diode.

8. The system of claim 1 wherein said active solid state component is a transistor.

9. The system of claim 1 wherein said means for producing a modulated light signal includes a second oscillator and a direct current source both of which are selectively coupled to a laser diode so that the light signal selectively produced by said laser diode includes a dc component, and a modulation component at the frequency of the output signal from said second oscillator and wherein said first oscillator includes means for biasing said solid state component below the oscillation threshold in the absence of the application of said light signal to said solid state component but so that said oscillator oscillates in phase with said modulation component when said solid state component is illuminated by said light signal.

10. An optically synchronized microwave oscillator system, comprising:
   means for producing a light signal whose intensity is sinusoidally modulated at a microwave frequency;
   a first microwave oscillator comprising an active solid state component in a microwave cavity structure; and
   an optical fiber waveguide, coupled between said means for producing a light signal and said active solid state component, for applying said light signal to said active solid state component;
   whereby the output energy from said microwave oscillator is phase synchronized with the modulation component of said light signal.

11. The system of claim 10 wherein said active solid state component is an IMPATT diode, said means for producing a light signal includes a laser diode and said optical fiber waveguide is coupled between said IMPATT diode and said laser diode.

12. The system of claim 10 wherein said means for producing a light signal includes a second microwave oscillator selectively coupled to a laser diode whereby the output light signal from said laser diode is modulated at the frequency of the output signal from said second oscillator.

13. The system of claim 10 wherein said active solid state component is an IMPATT diode.

14. The system of claim 10 wherein said active solid state component is a transistor.

15. A microwave oscillator system adapted for being optically phase locked and switched, comprising:
   means for selectively producing a light signal which has a modulation component which is sinusoidally modulated at a preselected frequency and a dc component;
   a microwave oscillator comprising an active solid state component in a microwave cavity structure having a port formed therein and means for biasing said solid state component below the oscillation threshold in the absence of the application of said light signal to said solid state component but so that said oscillator oscillates when illuminated by said light signal; and
   an optical fiber waveguide coupled from said means for producing a light signal and through said port to said active solid state component so as to apply said light signal to said active solid state component so as to cause the output energy from said microwave oscillator to be phase synchronized with the modulation component of said light signal.

16. The system of claim 15 wherein said active solid state component is a diode.

17. The system of claim 15 wherein said active solid state component is an IMPATT diode.

18. An optically synchronized microwave oscillator system, comprising:
   means for producing a light signal whose intensity is modulated so as to have a modulation component which varies sinusoidally at a microwave frequency;
   a first microwave oscillator comprising an active solid state component in a microwave cavity structure; and
   means for applying said light signal to said active solid state component so as to cause the output energy from said first oscillator to be in phase synchronization with said sinusoidally varying modulation component of said light signal or with one of its harmonics.

* * * * *